United States Patent
Reber

(10) Patent No.: US 6,707,336 B2
(45) Date of Patent: Mar. 16, 2004

(54) OPERATIONAL AMPLIFIER WITH CHOPPED INPUT TRANSISTOR PAIR

(75) Inventor: Martin Reber, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/277,568

(22) Filed: Oct. 22, 2002

(65) Prior Publication Data

US 2003/0080810 A1 May 1, 2003

(30) Foreign Application Priority Data

Oct. 25, 2001 (EP) .............................. 01204076

(51) Int. Cl.[7] .............................................. H03F 1/02
(52) U.S. Cl. ............................ 330/9; 330/253; 330/69; 327/124
(58) Field of Search ........................... 330/9, 253, 254, 330/69, 51; 327/124

(56) References Cited

U.S. PATENT DOCUMENTS

| | | | |
|---|---|---|---|
| 4,947,135 A | 8/1990 | Mijuskovic | 330/9 |
| 6,140,872 A * | 10/2000 | McEldowney | 330/9 |
| 6,307,430 B1 | 10/2001 | Thomsen et al. | 330/9 |
| 6,529,070 B1 * | 3/2003 | Nagaraj | 330/9 |
| 6,538,502 B2 * | 3/2003 | Nair et al. | 330/9 |

* cited by examiner

*Primary Examiner*—Henry Choe
(74) *Attorney, Agent, or Firm*—Aaron Waxler

(57) ABSTRACT

The invention relates to an operational amplifier comprising a first transistor amplifier stage at an input of the operational amplifier, which first transistor amplifier stage comprises chopped transistors, a second transistor amplifier stage cascoded to the first transistor amplifier stage, which second transistor amplifier stage is connected between the chopped first transistor amplifier stage and a supply voltage source, wherein the gain at the output of the chopped first transistor amplifier stage is reduced to $g_{m1,2}/g_{m3,4}$, where $g_{m1,2}*Rc$ is the gain of the first transistor amplifier stage, $g_{m3,42}*Rc$ is the gain of the second transistor amplifier stage and Rc is the resistance of the resistor between an output of the operational amplifier and the supply voltage source. An operational amplifier circuit comprises a main operational amplifier as specified above and feedback loops including capacitors between the inputs and outputs of the operational amplifier to form an integrator circuit or a filter circuit.

9 Claims, 3 Drawing Sheets

OPERATIONAL AMPLIFIER WITH CHOPPED INPUT TRANSISTOR PAIR

The invention relates to an operational amplifier circuit with chopped input transistor pair and an operational amplifier circuit comprising such an operational amplifier.

The demand for mobile equipment, like telecommunication products, computers and the like, in combination with higher integration levels results in an on going trend towards complete system on a single device. Generally, mixed signal chips have large digital parts and only a small area is used to implement the analog functionality. Therefore, the preferred process technology for manufacturing signal chips is CMOS. At the present, there are problems to provide the required performance for telecommunication applications with pure digital CMOS processes. It is desirable to improve this technology in order to get also to single chip solutions for applications like GSM (global system for mobile communications) or Bluetooth in CMOS technology.

One of the basic problems in CMOS technology is the 1/f-noise. Basically, there are three ways to handle 1/f-noise: one can use BICMOS instead of pure CMOS technologies, one can use very large transistors or one applies chopping. BICMOS is much more expensive than CMOS and usually generations behind the latest CMOS process. Using large transistors will result in lower 1/f-noise but has the drawback of an increased current consumption and higher capacitances in the circuit. A degraded performance and increased costs would be the results of this solution. The only way, to overcome 1/f-noise problem without costs disadvantages appears to be chopping. In circuits for telecommunications applications chopping causes, however, a fundamental problem which is cross-modulation. Due to cross-modulation the output signal at the operational amplifier output will not consist of the amplified input signal alone but has an additional error signal as well. This error signal is composed out of two components: the spikes seen when switching the chopper switches and an image of the input signal which is shifted in frequency by the chopping frequency. This image appears if the switching spikes are not constant for all input signals but depend on the input signal level seen at the operational amplifier input. The spikes itself are in most cases uncritical but the image of the input signal may degrade the performance of telecommunications circuits severely.

In a conventional chopping circuit of a differential amplifier, the input transistor pair of the amplifier stage are chopped with a frequency of $f_{chop}$ for chopping the 1/f-noise of the input transistors. The problem of cross modulation occurs at the switches at the output of the input transistors because the signal which is input to the differential amplifier, is amplified, at that point of the circuit, with a gain of $g_{m1,2}*Rc$, and this gain is large enough to produce distortion due to switching (cross modulation) which distortion is input-signal dependent. Therefore, in order to use chopping in circuits which are adapted for telecommunication applications, it is required to reduce cross modulation or distortion of the signal at the output of the input amplifier stage.

In view of the above, it is an object of the invention to provide an operational amplifier with chopped input transistors which is optimized for low noise and low voltage and are, thereby, adapted in particular for telecommunication applications like GSM, Bluetooth or HiperLAN applications.

For this purpose, the invention provides an operational amplifier comprising a first transistor amplifier stage at an input of the operational amplifier, which first transistor amplifier stage comprises chopped transistors, a second transistor amplifier stage cascoded to the first transistor amplifier stage, which second transistor amplifier stage is connected between the chopped first transistor amplifier stage and a supply voltage source, wherein the gain at the output of the chopped first transistor amplifier stage is reduced to $g_{m1,2}/g_{m3,4}$, where $g_{m1,2}*Rc$ is the gain of the complete input stage, $9_{m3,4}*Rc$ is the gain of the second transistor amplifier stage and Rc is the resistance of the resistor between an output of the operational amplifier and the supply voltage source.

In cascoded amplifier stages, the transistors of the cascoded amplifier stage do not contribute significantly to the 1/f-noise because the signal level of the useful signal is, at that point of the circuit, well above the noise level and, furthermore, the signal transfer function for the 1/f noise of the cascade stage is limited due to the high output impedance of the input transistors. Therefore, the remaining 1/f-noise is only due to the transistors at the input amplification stage where cross modulation is not a major problem anymore because the gain of the output signal of the input amplification stage is now reduced to $g_{m1,2}/g_{m3,4}$ which means that the signal level and the output of the input amplification stage is not high enough anymore to produce substantial cross modulation. Therefore, the cross modulation or distortion of the signal due to switching of the input signals in the chopping scheme is dramatically reduced.

According to a preferred embodiment of the invention, the first transistor amplifier stage comprises a first and a second transistor connected to first and second switches, the second transistor amplifier stage is connected to the first amplifier stage through third and forth switches, the switches receiving a chopping frequency $f_{chop}$ to chop the inputs/outputs of the first and second transistor. In this operational amplifier circuit, the second transistor amplifier stage is directly connected to the switches at the output of the first amplifier stage which is a simple and the most effective way to embody the invention while ensuring that the cross modulation at the output switches of the chopped first amplifier stage is reduced.

According to a further preferred embodiment of the invention, the second transistor amplifier stage comprises a third and a forth transistor, the third and forth transistors of the second amplifier stage being connected to the supply voltage source through resistors. For high common mode suppression, the source terminals of the first and second transistors of the first amplifier stage are preferably connected via a current source establishing the voltage $U_{CS}$ between the input transistor sources and ground. The total amplification of both the first and the second amplifier stage can be balances such that the cross modulation is reduced at the output of the first amplifier stages whereas the desired total amplification is achieved by a combined effect of the first and the second amplifier stage.

According to a further preferred embodiment of the invention, the base terminals of the third and forth transistor of the second amplifier stage are connected via a bias voltage source $U_{bias}$ to ground, which is an efficient way to control the operation of the transistors of the second amplifier stage.

According to a further preferred embodiment of the invention, the second transistor amplifier stage comprises a further transistor which is connected to a supply voltage source acting as a current source. This is an alternative circuit arrangement for the input amplifier stage where the source of the transistor of the first amplifier stage is connected to ground. A common mode suppression is achieved by using a common mode output voltage regulator. Therefore, the source terminal and the backgate terminal of this transistor are on the same potential level which speeds up the operation of the transistor in the input amplifier stage.

According to a further preferred embodiment of the invention, the base terminal of the cascode transistor is connected via a bias voltage source $U_{bias}$ to ground. This, again, contributes to the freedom of properly designing the gain of the two amplifier stages.

For the above purpose, the invention provides an operational amplifier circuit comprising a main operational amplifier, wherein the main operational amplifier comprises feedback loops including capacitors between its inputs and outputs to form an integrator circuit or a filter circuit. This is an operational amplifier circuit in which one operational amplifier as specified above is used as a main operational amplifier and is connected to appropriate feedback loops to form an integrator or a filter. This example shows that the operational amplifier of the invention can be used in various circuits like integrators, filters, sigma delta converters regulators and the like.

For the above purpose, the invention provides an operational amplifier circuit comprising two symmetrical amplifiers acting in a feedback loop including capacitors between their inputs and outputs to form an integrator or filter circuit.

According to a preferred embodiment of the invention, a voltage control means is connected to the main operational amplifier to provide a voltage difference between the output common mode voltage and the input common mode voltage of the main operational amplifier to apply a DC biasing voltage across the non-linear capacitor sufficient to operate the non-linear capacitor in a bias range where the capacity of the none-linear capacitor is almost independent of the applied voltage comprising the bias voltage plus a signal voltage. This embodiment of the invention improves the linearity of the overall circuit in case semiconductor capacitances (e.g. gateoxide capacitors) are used which also contributes to improve the circuit of the invention in a way to be used in telecommunication applications. Furthermore, such a circuit is the basis for a cost efficient production of the circuit in a pure MOS, in particular CMOS, processing technology.

According to a further preferred embodiment of the invention, the voltage control means comprise a voltage regulator for regulating the common mode output voltage of the main operational amplifier to the preset output common mode voltage. Preferably, the voltage regulator comprises a regulator operational amplifier one input of which is fed by a said common mode output voltage $CM_{out}$, and the other input of which regulator operational amplifier is connected via a first resistor to one output of the main operational amplifier and via a second resistor to the other output of the main operational amplifier, and wherein an output of the regulator operational amplifier is connected via a third resistor to one of the inputs of the main operational amplifier and via a fourth resistor to another input of the main operational amplifier. Such a voltage regulator assures, in combination to means for controlling the input common mode voltage, that the required linearity is attained.

According to a further preferred embodiment of the invention, the voltage control means comprise an input stage adapted to provide a constant DC common mode voltage to the input of the operational amplifier circuit. This is one of the possibilities to assure an appropriate common mode voltage at the input of the operational amplifier circuit.

According to a further preferred embodiment of the invention, the input stage behaves like a voltage source $U_{CM,DC}$ connected to the inputs of the operational amplifier circuit, which is a simple and effective way to provide the constant DC common mode voltage at the input of the operational amplifier circuit.

According to a further preferred embodiment of the invention, the input stage comprises means for setting an internal voltage $V_T$ at the input stage of the operational amplifier circuit. By setting the internal voltage $V_T$ (T=threshold), a separate input stage for providing a common mode voltage can be avoided.

According to a further preferred embodiment of the invention, the sources of the input transistors of the input stage are connected to ground which speeds up the operation of the transistor considerably. Since source and backgate (or bulk) of the input stage transistors are on the same level (ground) or, in other words there is no control voltage applied to the backgate, the amplification factor of the transistors is at a maximum. If the source-bulk-voltage was above zero volts, the gain would be reduced. Therefore, in order to obtain the same gain, the transistor would have to be redesigned to occupy a larger area and to consume more current. The circuit of the invention where the source and the bulk of the transistor are on the same level, has, therefore, the advantages of a lowered current consumption which is important for low voltage/low power embodiments, a smaller area on the chip and higher speed which allows new applications of the circuit.

According to a further preferred embodiment of the invention, circuits using such operational amplifier circuits are made by pure digital CMOS processes. The above operational amplifier and the circuits built up by using such an amplifier are a good basis for manufacturing the devices on one single chip including the digital and analog functionality by using CMOS processes which are, at present, the most popular processes to manufacture semiconductor devices for the above mentioned applications.

Embodiments of the invention are now described with reference to the drawings, in which.

Figure 1:
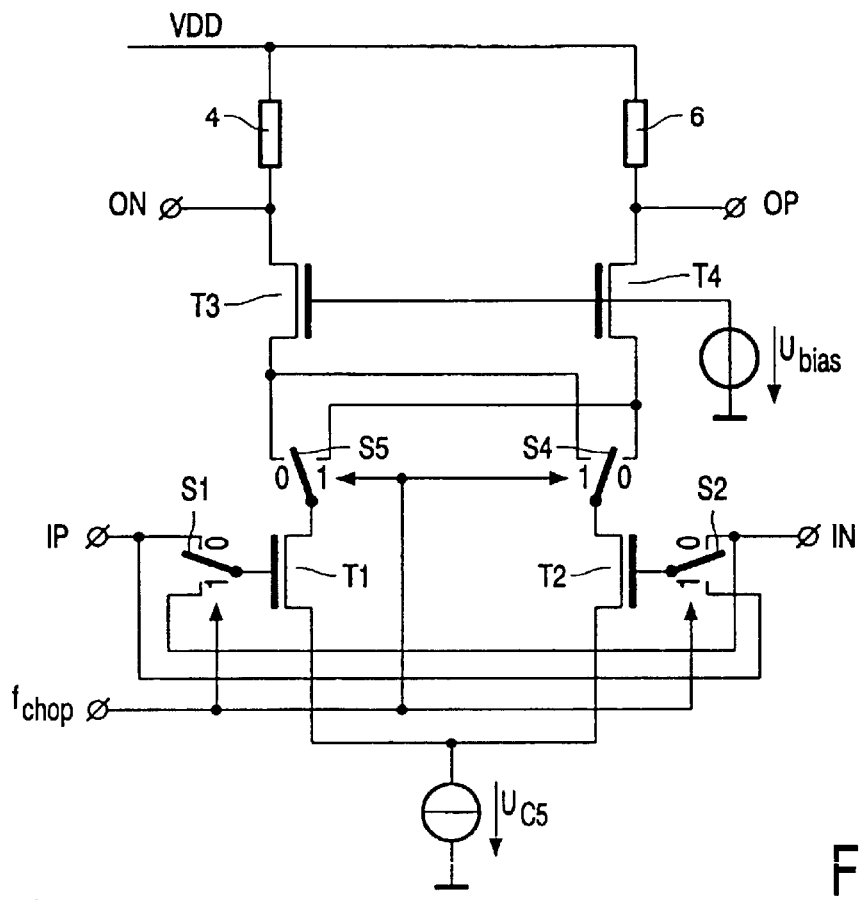
FIG. 1 is an operational amplifier circuit with a chopped input transistor pair as an example of the invention.

According to FIG. 1, the input stage of an operational amplifier 2 comprises two inputs IP (positive input signal) and IN (negative input signal) and two outputs ON (negative output signal) and OP (positive output signal). The inputs IP, IN are connected to two transistors T1 and T2 of a first amplifier stage through switches S1 and S2. The two transistors T1 and T2 are connected to two further transistors T3 and T4 of a second amplifier stage through switches S3 and S4. The switches S1 to S4 receive a chopping frequency $f_{chop}$ to chop the inputs/outputs of the transistors T1 and T2. The two transistors T3 and T4 of a second amplifier stage are connected to a voltage source supplying the supply voltage VDD trough resistors 4,6. The outputs (drain terminals) of the transistors T3 and T4 are the negative output ON and the positive output OP of the operational amplifier 2 respectively. The source terminals of the transistors T1 and T2 are connected via a current source $U_{CS}$ to ground, and the base terminals of the transistors T3 and T4 are connected via a bias voltage source $U_{bias}$ to ground. The current source $U_{CS}$ has a defined output impedance $R_{out}$.

In the above circuit arrangement, the gain at the output of the chopped first transistor amplifier stage is reduced to $g_{m1,2}/g_{m3,4}$, where $g_{m1,2}*Rc$ is the overall gain of the differential amplifier input stage, $9_{m3,4}*Rc$ is the gain of the second transistor amplifier stage and Rc is the resistance of the resistor between an output of the operational amplifier and the supply voltage source.

Figure 2:
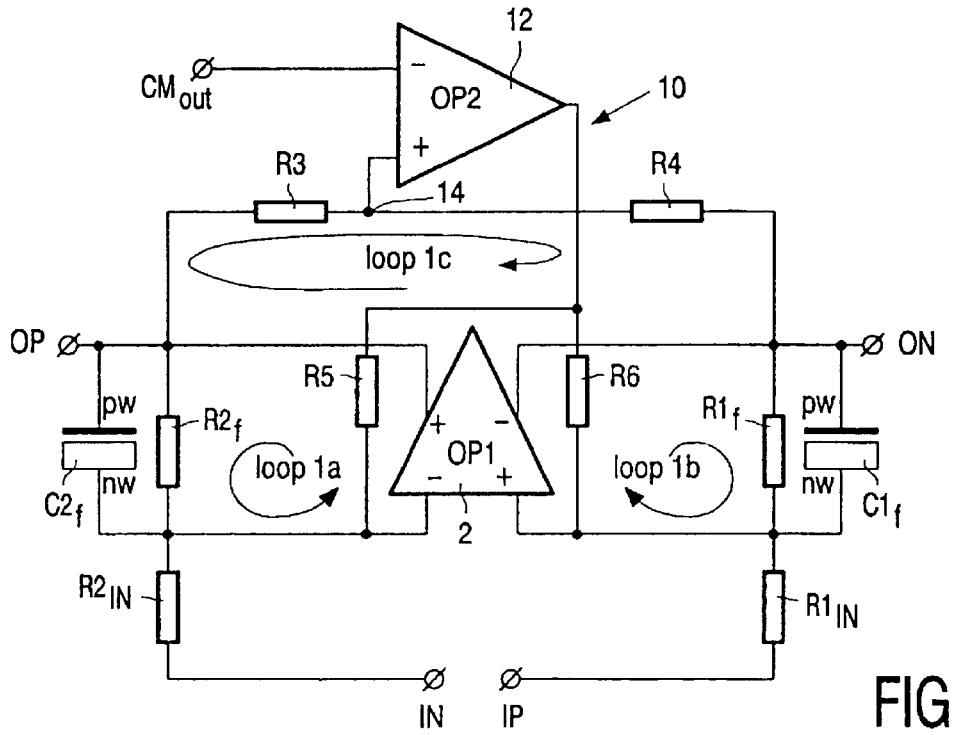
FIG. 2 is a circuit diagram of the analogue low pass filter circuit using the operational amplifier of FIG. 1.

FIG. 2 is a circuit diagram of an analogue low pass filter circuit using the operational amplifier 2 (OP1) of FIG. 1. The operational amplifier 2 which has limited common mode suppression, is connected to two feedback loops 1a and 1b where the feedback loop 1b comprises a feedback resistor $R1_f$ and a capacitor $C1_f$, and the feedback loop 1a comprises a feedback resistor $R2_f$ and a feedback capacitor $C2_f$. The feedback resistor $R1_f$ and the capacitor $C1_f$ on the one hand and the feedback resistor $R2_f$ and the feedback capacitor $C2_f$ are connected in parallel, respectively. The feedback capacitors $C1_f$ and $C2_f$ are gateoxide capacitors.

Figure 3:
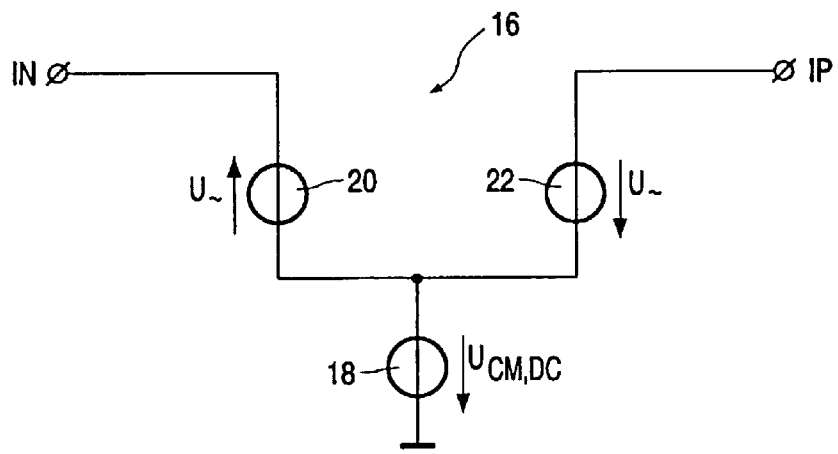
FIG. 3 is a circuit diagram explaining the behavior of the driver at the input stage of the filter circuit of FIG. 2.

A voltage control means is connected to the operational amplifier 2 to provide a voltage difference between the output common mode voltage and the input common mode voltage of the main operational amplifier 2 to apply a DC biasing voltage across the non-linear gateoxide capacitors $C1_f$ and $C2_f$ sufficient to operate the non-linear gateoxide capacitors $C1_f$ and $C2_f$ in a bias range where the capacitance of the gateoxide capacitors $C1_f$, $C2_f$ is almost independent of the applied voltage comprising the bias voltage plus a signal voltage (see FIG. 3). The voltage control means is adapted to provide a constant DC common mode voltage to the input/output of the main operational input amplifier 2.

In the low pass filter circuit of FIG. 2, the voltage control means is put around the main operational amplifier 2 to guarantee a fixed DC biasing voltage across the gate oxide capacitors $C1_f$, $C2_f$. This arrangement results in a linear operation and, furthermore, assures that the gateoxide capacitors $C1_f$, $C2_f$ show the largest possible capacitance for a given area.

The different common mode voltage at the inputs and outputs of the main operational amplifier 2 results in a constant DC current through the resistors $R1_f$, $R2_f$ and $R1_{IN}$, $R2_{IN}$. The constant DC biasing voltage $U_C$ can be generated in a way which prevents a reduced output voltage arranged for the low pass filter circuit of FIG. 1.

The voltage control means of FIG. 2 comprise a voltage regulator 10 for regulating the common mode output voltage of the main operational amplifier 2. The voltage regulator comprises a regulator operational amplifier 12 one input of which is fed by a common mode output voltage $CM_{OUT}$ and the other input of which regulator operational amplifier 12 is connected via a first resistor R3 to one output OP of the main operational amplifier 2 and via a second resistor R4 to the other output ON of the main operational amplifier 2. The output of the regulator operational amplifier 12 (OP2) is connected via a third resistor R5 to one of the inputs IN of the main operational amplifier 2 and via a forth resistor R6 to another input IP of the main operational amplifier 2. The first and second resistors R3, R4 have the same resistance value, and the third and forth resistors R5, R6 also have the same resistance value.

The common mode output voltage $CM_{out}$ is set at the inverting input of the regulator operational amplifier 12. The non-inverting input of the regulator operational amplifier 12 is connected to the measured common mode output voltage of the main operational amplifier 2 at point 14 between the two resistors R3 and R4. If the measured common mode output voltage of the main operational amplifier 2 is different from $CM_{out}$, the regulator operational amplifier 12 produces at its output a voltage which is fed via R5 and R6 to the inputs of the main operational amplifier 2 and adjusts the common mode output voltage of the main operational amplifier 2 to $CM_{out}$ (circuit loop 1C). The common mode input voltage of the main operational amplifier 2 is set with the resistive network consisting of $R1_{IN}$, $R2_{IN}$; $R1_f$, $R2_f$ and resistors R5 and R6. The resistors R5, R6 do not determine the differential signal transfer function of the low pass filter circuit of FIG. 2.

The voltage control means of FIG. 2 furthermore presume an input stage driver as shown in FIG. 3 which is adapted to provide a preset DC common mode voltage to the input of the low pass filter circuit. The input stage driver circuit 16 comprises a CM, DC voltage source 18 connected to the inputs IN, IP of the filter circuit of FIG. 1 or 2, respectively. The input signal is fed to the input stage 16 between the CM, DC voltage source 18 and the inputs IN, IP as indicated by voltage sources 20, 22. The input stage 16 adjusts the input common voltage at a level close to the supply voltages.

Figure 4:
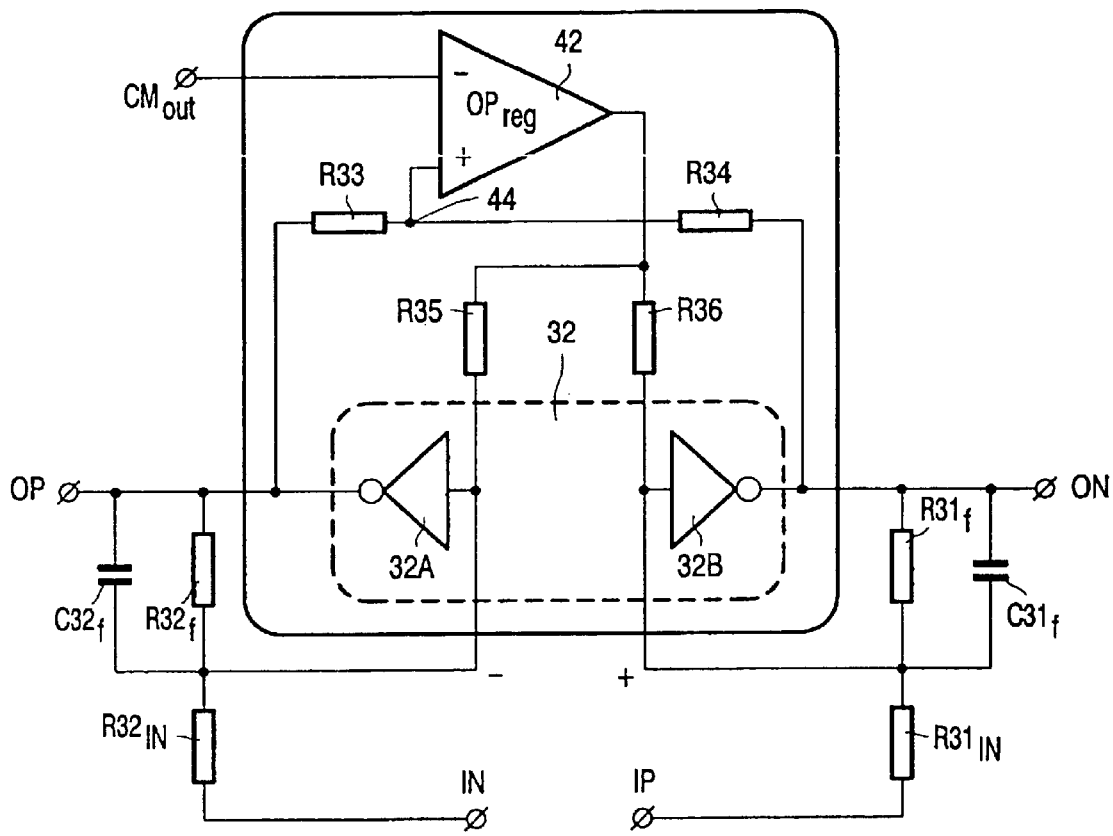
FIG. 4 is a analogue low pass filter circuit with two independent amplifiers with a chopped input transistor pair.

FIG. 4 is an analogue low pass filter circuit of another embodiment of the invention. The main operational amplifier 32 of FIG. 4 consists of a pair of independent, symmetric amplifiers 32A, 32B with a chopped input transistors pair. The embodiment of FIG. 4 also shows the concept of putting a voltage control means around a main operational amplifier 32 providing for linearity of the filter circuit in spite of the fact that the capacitors $C31_f$, $C32_f$ are non-linear gateoxide capacitors.

The voltage control means comprises a voltage regulator for regulating the common mode output voltage of the operational amplifiers to the preset output common mode voltage. The voltage regulator comprises a regulator operational amplifier 42 one input of which is fed by a said common mode output voltage $CM_{out}$ and the other input of which regulator operational amplifier 42 is connected via a first resistor R33 to one output of the operational amplifier pair 32A, 32B and via a second resistor R34 to the other output of the operational amplifier pair 32A, 32B. The output of the regulator operational amplifier 42 is connected via a third resistor R35 to the input of the operational amplifier 32A and via a fourth resistor R36 to the input of the other operational amplifier 32B.

Figure 5:
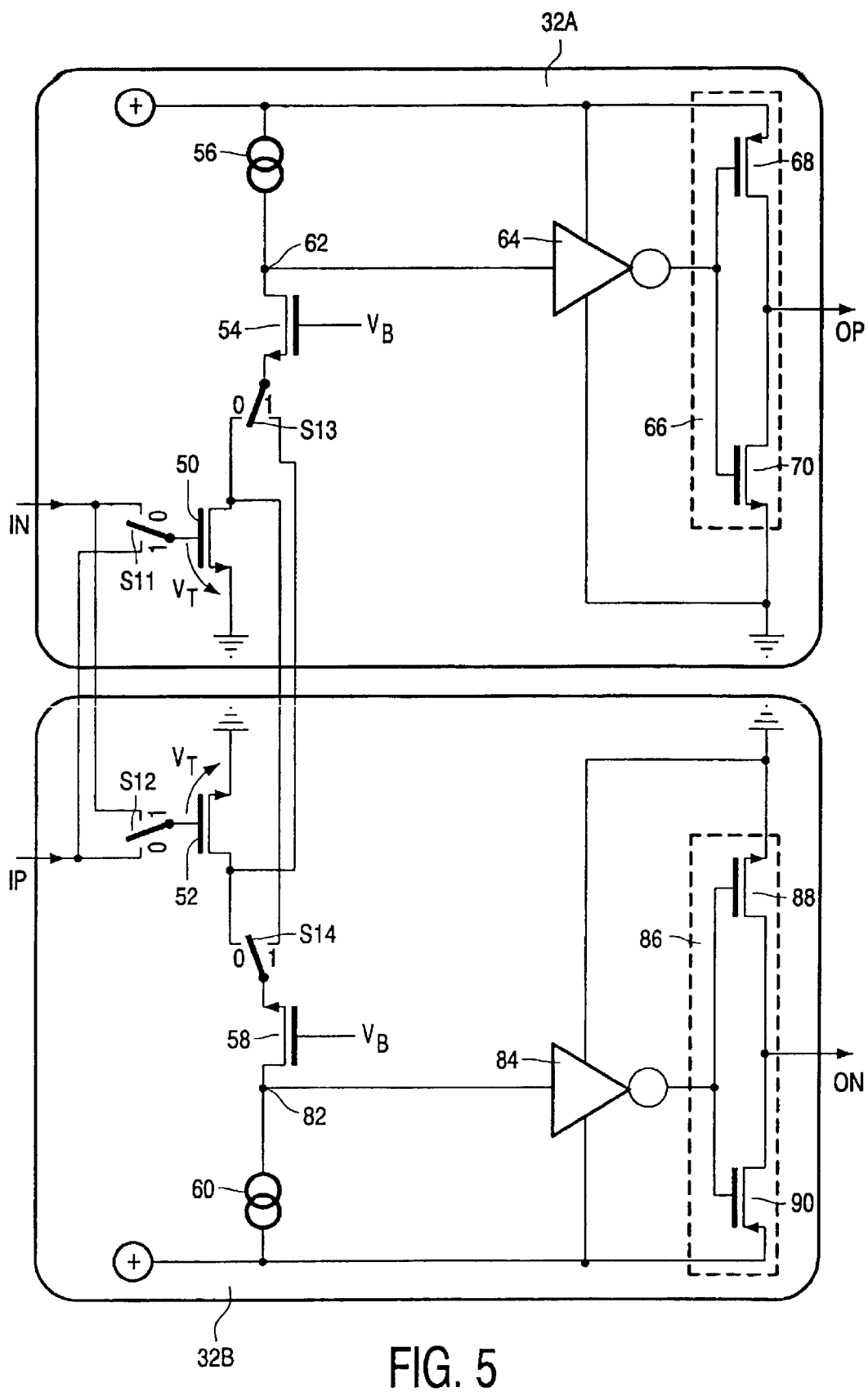
FIG. 5 is more detailed circuit diagram of the filter circuit of FIG. 4.

FIG. 5 shows a more detailed circuit diagram of the symmetric operational amplifiers 32A and 32B of FIG. 4 The filter circuit of FIG. 5 comprises two chopped input transistors 50, 52 with chopper switches S11, S13 related to transistors 50 and chopper switches S12, S14 related to transistors 52. The chopper switches S11, S12, S13, and S14 are connected to the transistors 50, 52 in a well-known chopper system arrangement. The source of transistor 50 is connected to ground and the drain of the transistor 50 is connected through the zero-contact of chopper switch S13, an amplifier transistor 54 and a current source 56 to supply voltage. The source of transistor 52 is connected to ground and the drain of transistor 52 is connected through the zero-contact of chopper switch S14 and amplifier transistor 58 and current source 60 to supply voltage.

The voltage $V_T$ is built up due to the feedback with the regulator operational amplifier 42 and the high amplification of the amplifiers 32A, 32B. The amount of this voltage $V_T$ could only be changed slightly by redesigning the transistors 56,52 or by changing the currents sources 56,60.

Node 62 between transistor 64 and current source 56 is connected through an amplifier 64 to an output stage 66 of amplifier 32A, which output stage 66 consists of two transistors 68, 70. The output stage 66 again is connected between ground and supply voltage.

The node 82 between transistor 58 and current source 60 is connected through an amplifier 84 to an output stage 86 of the operational amplifier 32B which output stage consists of two transistors 88, 90. The output stage 86 again is connected between ground and supply voltage.

In order to embody the feature that the input common voltage is adjusted to a preset level, the sources of the transistors 50, 52 are grounded, and the internal voltage $V_T$ at the input stage of the filter circuit is set. By means of this circuit arrangement, the said input voltage $V_T$ and the regulating function of the regulator operational amplifier 42 provide for the low cost implementation of the circuit device and the excellent linearity required for the specific application.

The operational amplifier circuit of FIGS. 4, 5 can be implemented in CMOS technology. The circuit operates in a first order low pass configuration with differential inputs and outputs and is adapted for example as a low pass filter which operates in a polyphase channel selection filter for a GSM receiver. This channel selection filter is able for the first time to achieve the required performance with respect to noise, linearity and current consumption without producing an unacceptable cross modulation. The basis for this advantageous operational amplifier circuit is the chopping scheme of the invention without which a CMOS polyphase filter circuit could not have been designed with such a favorable characteristics.

It is apparent from the above description, that the operational amplifier circuits which are constructed according to the invention can be used as integrator circuits or filter circuits, like first, second or third order active filters. The integrator circuits can be used in more complex circuits like sigma delta converters, regulators, analog filter banks and the like, where the use of non-linear capacitors is desirable.

What is claimed is:

1. An operational amplifier comprising:
   a first transistor amplifier stage at an input of the operational amplifier, which first transistor amplifier stage comprises chopped transistors;
   a second transistor amplifier stage cascoded to the first transistor amplifier stage, which second transistor amplifier stage is connected between the chopped first transistor amplifier stage and a supply voltage source;
   wherein the gain at the output of the chopped first transistor amplifier stage is reduced to $g_{m1,2}/g_{m3,4}$, where $g_{m1,2}*Rc$ is the gain of the complete input stages, $g_{m3,4}*Rc$ is the gain of the second transistor amplifier stage and Rc is the resistance of the resistor between an output of the operational amplifier and the supply voltage source.

2. The operational amplifier of claim 1, wherein the first transistor amplifier stage comprises a first and a second transistor (T1, T2; 50, 51) connected to first and second switches (S1, S2; S11, S12), the second transistor amplifier stage is connected to the first amplifier stage through third and forth switches (S3, S4; S12, S14), the switches (S1 to S4; S11 to S14) receiving a chopping frequency $f_{chop}$ to chop the inputs/outputs of the first and second transistor (T1, T2; 50, 51).

3. The operational amplifier of claim 2, wherein the source terminal of the transistor of the first amplifier stage is connected to ground; and wherein the second transistor amplifier stage comprises a further transistor (54) which is connected to a supply voltage source trough a current source (56).

4. Operational amplifier circuit comprising a main operational amplifier according to claim 1, wherein the main operational amplifier comprises feedback loops including capacitors between its inputs and outputs to form an integrator circuit or a filter circuit.

5. Operational amplifier circuit comprising two symmetrical amplifiers according to claim 3, wherein the main operational amplifiers comprise feedback loops including capacitors between their inputs and outputs to form an integrator circuit or a filter circuit.

6. The circuit of claim 4, wherein a voltage control means is connected to the main operational amplifier to provide a voltage difference between the output common mode voltage and the input common mode voltage of the main operational amplifier to apply a DC biasing voltage across the non-linear capacitor sufficient to operate the non-linear capacitor in a bias range where the capacity of the nonelinear capacitor is almost independent of the applied voltage comprising the bias voltage plus a signal voltage.

7. The circuit of claim 6, wherein the voltage control means comprises a voltage regulator for regulating the common mode output voltage of the main operational amplifier to the preset output common mode voltage.

8. The circuit of claim 7, wherein the voltage control means comprises an input stage adapted to provide a constant DC common mode voltage to the input of the operational amplifier circuit.

9. The circuit of claim 4, wherein the sources of the input transistors of the input stage are connected to ground.

* * * * *